(12) United States Patent
Jain et al.

(10) Patent No.: US 6,713,360 B2
(45) Date of Patent: Mar. 30, 2004

(54) SYSTEM FOR REDUCING SEGREGATION AND DIFFUSION OF HALO IMPLANTS INTO HIGHLY DOPED REGIONS

(75) Inventors: Amitabh Jain, Richardson, TX (US); Kaiping Liu, Plano, TX (US); Zhiqiang Wu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/218,027

(22) Filed: Aug. 12, 2002

(65) Prior Publication Data

US 2003/0124823 A1 Jul. 3, 2003

Related U.S. Application Data

(60) Provisional application No. 60/344,409, filed on Dec. 28, 2001.

(51) Int. Cl.[7] .................... H01L 21/331; H01L 21/265
(52) U.S. Cl. ................ 438/306; 438/519; 438/522
(58) Field of Search ................ 438/301, 306, 438/519, 522, 527, 530

(56) References Cited

U.S. PATENT DOCUMENTS

| 5,382,533 A | * | 1/1995 | Ahmad et al. | 437/24 |
|---|---|---|---|---|
| 5,670,397 A | * | 9/1997 | Chang et al. | 437/34 |
| 5,998,284 A | * | 12/1999 | Azuma | 438/514 |
| 6,362,063 B1 | * | 3/2002 | Maszara et al. | 438/307 |
| 6,492,670 B1 | * | 12/2002 | Yu | 257/284 |

* cited by examiner

*Primary Examiner*—Amir Zarabian
*Assistant Examiner*—Pamela E Perkins
(74) *Attorney, Agent, or Firm*—Peter K. McLarty; W. James Brady, III; Frederick J. Telecky, Jr.

(57) ABSTRACT

The present invention provides a method for forming a transistor junction in a semiconductor wafer by implanting a dopant material (116) into the semiconductor wafer, implanting a halo material (110) into the semiconductor wafer (102), selecting a fluorine dose and energy to tailor one or more characteristics of the transistor, implanting fluorine into the semiconductor wafer at the selected dose and energy, activating the dopant material using a thermal process and annealing the semiconductor wafer to remove residual fluorine. The one or more characteristics of the transistor may include halo segregation, halo diffusion, the sharpness of the halo profile, dopant activation, dopant profile sharpness, drive current, bottom wall capacitance or near edge capacitance.

2 Claims, 7 Drawing Sheets

SYSTEM FOR REDUCING SEGREGATION AND DIFFUSION OF HALO IMPLANTS INTO HIGHLY DOPED REGIONS

This application claims priority from Provisional Application Ser. No.: 60/344,409, filed on Dec. 28, 2001.

TECHNICAL FIELD OF THE INVENTION

The present invention relates generally to the field of semiconductor devices, and more particularly to a method for reducing segregation and diffusion of halo implants into highly doped regions.

BACKGROUND OF THE INVENTION

When transistor gate length is scaled down, the impact of the halo profile on device performance becomes more important. The halo profile not only determines the magnitude of the transistor short-channel-effect, but also impacts the transistor channel mobility, Cj, diode leakage, and drive current. Since the profile of the halo is mainly determined by its diffusivity, many super halo processes proposed earlier were centered on the use of disposable spacer, reduced thermal budget, or heavy ion species with low diffusivity. These approaches suffer various shortcomings, such as increased process complexity, reduced dopant activation level in silicon or poly gate, etc. The use of fluorine implant at different steps of the process has been studied for many years to improve pMOS NBTI, reduce hot-carrier damage and produce shallow boron highly doped drain ("HDD") extension. These fluorine implants have not, however, been used to tailor the profile of the halo implants to provide different electrical characteristics in sub-50 nm transistors.

SUMMARY OF THE INVENTION

The present invention provides a method that allows the profile of the halo implants to be tailored to provide different electrical characteristics in sub-50 nm transistors. Moreover, the present invention reduces halo implant segregation and diffusion into highly doped regions of the transistor by using fluorine to produce super-halo for both nMOS and pMOS transistors. The fluorine-assisted halo process of the present invention produces a super-sharp halo profile and reduces halo dopant segregation into HDD by reducing halo dopant diffusivity. Furthermore, the degree of halo profile sharpness and the amount of dopant segregation can be tailored by varying the fluorine implant conditions. As a result, different transistor parametric requirements can be met, such as lowered junction capacitance (Cj) and improved Ion-Ioff characteristics, by trading off the sharpness of the halo and the smoothness of the junction.

The present invention provides a method for forming a transistor junction in a semiconductor wafer by implanting a dopant material into the semiconductor wafer, implanting a halo material into the semiconductor wafer, selecting a fluorine dose and energy to tailor one or more characteristics of the transistor, implanting fluorine into the semiconductor wafer at the selected dose and energy, activating the dopant material using a thermal process and annealing the semiconductor wafer to remove residual fluorine. The one or more characteristics of the transistor may include halo segregation, halo diffusion, the sharpness of the halo profile, dopant activation, dopant profile sharpness, drive current, bottom wall capacitance or near edge capacitance.

In addition, the present invention provides a method of fabricating a transistor by forming a gate dielectric over a semiconductor body, forming a gate electrode over the gate dielectric, forming an implant blocking spacer adjacent sidewalls of the gate electrode, forming a first doped region of a first conductivity type in the semiconductor body adjacent the implant blocking spacer, forming a halo region of a second conductivity type in the semiconductor body at least partially under the implant blocking spacer to form a halo in the semiconductor body, selecting a fluorine dose and energy to tailor one or more characteristics of the transistor, implanting fluorine into the halo region at the selected dose and energy, forming a sidewall spacer adjacent to the implant blocking spacer and forming deep source/drain region in the semiconductor body aligned to the sidewall spacer.

Other features and advantages of the present invention will be apparent to those of ordinary skill in the art upon reference to the following detailed description taken in conjunction with the accompanying drawings.

BRIEF DESCRIPTION OF THE DRAWINGS

For a better understanding of the invention, and to show by way of example how the same may be carried into effect, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts, which can be embodied in a wide variety of specific contexts. The invention will now be described in conjunction with a n-type transistor using a CMOS process. It will be apparent to those of ordinary skill in the art that the benefits of the invention may be applied to other CMOS processes (as well as nMOS and pMOS), and transistor sizes. It will also be apparent to those of ordinary skill in the art that the invention may be applied to p-type transistors by reversing the conductivity types. The specific embodiments discussed herein are merely illustrative of specific ways to make and use the invention and do not limit the scope of the invention.

The present invention provides a method that allows the profile of the halo implants to be tailored to provide different electrical characteristics in sub-50 nm transistors. Moreover, the present invention reduces halo implant segregation and diffusion into highly doped regions of the transistor by using fluorine to produce super-halo for both nMOS and pMOS transistors. The fluorine-assisted halo process of the present invention produces a super-sharp halo profile and reduces halo dopant segregation into HDD by reducing halo dopant diffusivity. Furthermore, the degree of halo profile sharpness and the amount of dopant segregation can be tailored by varying the fluorine implant conditions. As a result, different transistor parametric requirements can be met, such as lowered junction capacitance ("Cj") and improved Ion-Ioff characteristics, by trading off the sharpness of the halo and the smoothness of the junction.

Figure 1:
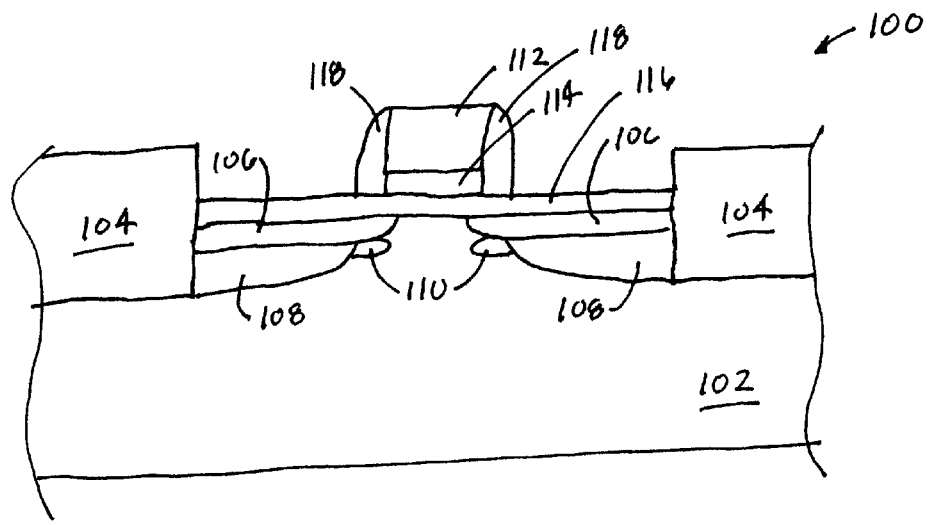
FIG. 1 is a cross-sectional diagram of a transistor having a halo implant in accordance with the present invention.

Referring now to FIG. 1, a cross-sectional diagram of a transistor 100 having a halo implant 110 in accordance with the present invention is shown. Transistor 100 is located in p-type substrate 102, which is part of a semiconductor wafer. Substrate 102 may alternatively refer to a p-type epitaxial layer formed on a substrate or a p-type well region formed in a substrate or epitaxial layer. Transistor 100 is isolated from other devices (not shown) by isolation regions 104. Isolation regions 104 are shown as field oxide regions. However, other types of isolation, such as shallow trench isolation, may also be used. Regions 106 are highly doped regions (n-type) commonly referred to as drain extensions. Transistor 100 may also include deep source/drain regions 108. As used herein, the first and second conductivity types refer to a n-type and p-type, respectively, or a p-type and n-type. Typical p-type materials are boron or phosphorus. A typical n-type material is arsenic.

Halo regions 110 are doped oppositely to drain extension regions 106. In the case of the n-type transistor, regions 110 are p-type. Peak concentration of the halo regions 110 are spaced from the surface of the substrate 102 to a greater extent and/or the lateral extent of a high halo concentration at the channel surface, extending from the drain extension inwards to the channel region, is reduced as will be described. Thus, the benefits of traditional halo regions, i.e., reduced threshold voltage rolloff, reduced nominal Vt, and improved nominal drive current, are maintained. In addition, drawback of conventional halos, i.e., enhanced dopant scattering due to enhanced dopant concentration over a large lateral extent near the channel surface, is significantly reduced. Because the halo regions 110 do not have a peak concentration to a significant lateral extent at the surface and/or are spaced from the surface of the substrate, the dopant concentration at the surface of the channel is not significantly enhanced by the halo as compared to conventional methods of forming transistors.

Gate electrode 112 is located on a gate dielectric 114, which is located on a threshold adjust implant 116. Gate dielectric 114 may be any suitable gate dielectric known in the art. Typically, gate dielectric 114 will comprise an oxide. Gate electrode 112 comprises a conductive material such as polysilicon, suicide, metal, or a combination thereof.

A thin sidewall spacer 118 is located on the sidewalls of gate electrode 112. Spacer 118 comprises a material or a composite of materials that reduces the implant range of dopants thus preventing dopants from reaching the surface of substrate 102 under the spacer 118 during an angled implant and/or reducing the lateral extension of dopants from the chain extension edge inwards to the channel at the surface of substrate 102 during an angled implant. The material chosen for spacer 118 has a smaller implant range than the underlying substrate and may include in part silicon nitride or silicon carbide. Additionally, silicon nitride and silicon carbide are materials which are not significantly reduced in thickness by standard wet chemical cleaning or stripping processes as compared to other materials as deposited oxides. Note that spacer 118 consist of more than one type of spacer formed at different times during the process.

Figure 2A:
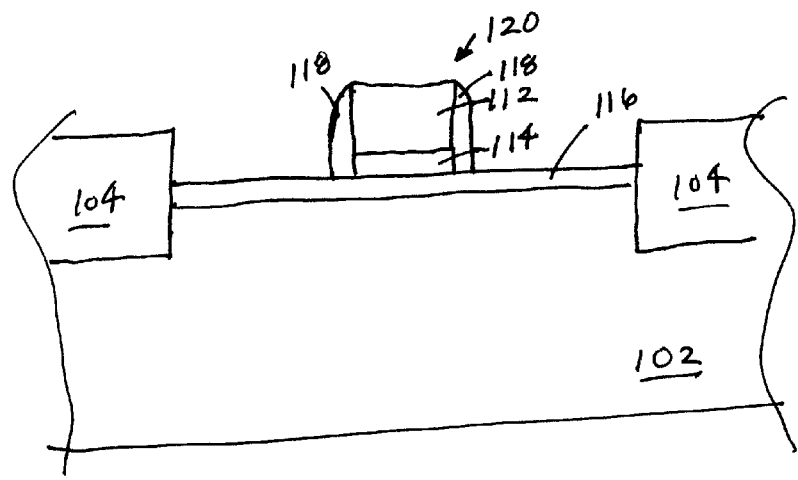
FIGS. 2A–2C are cross-sectional diagrams of the transistor of FIG. 1 at various stages of fabrication.
Figure 2B:
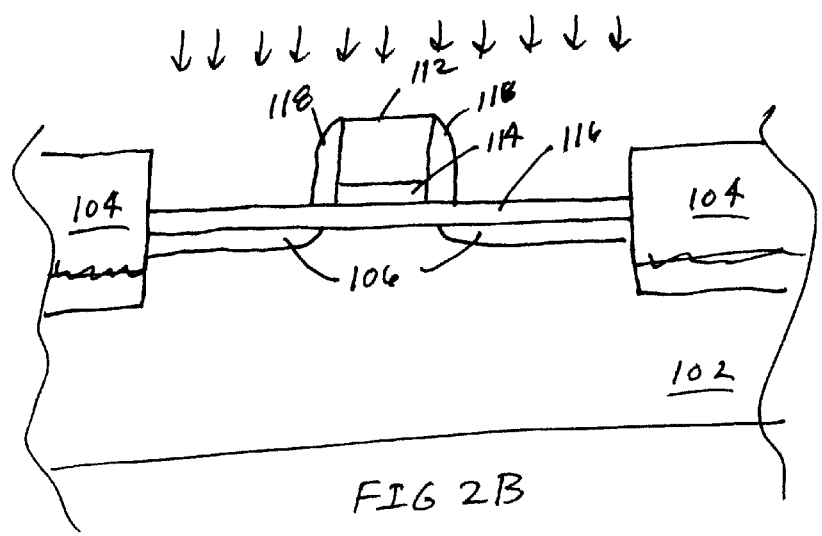
Figure 2C:
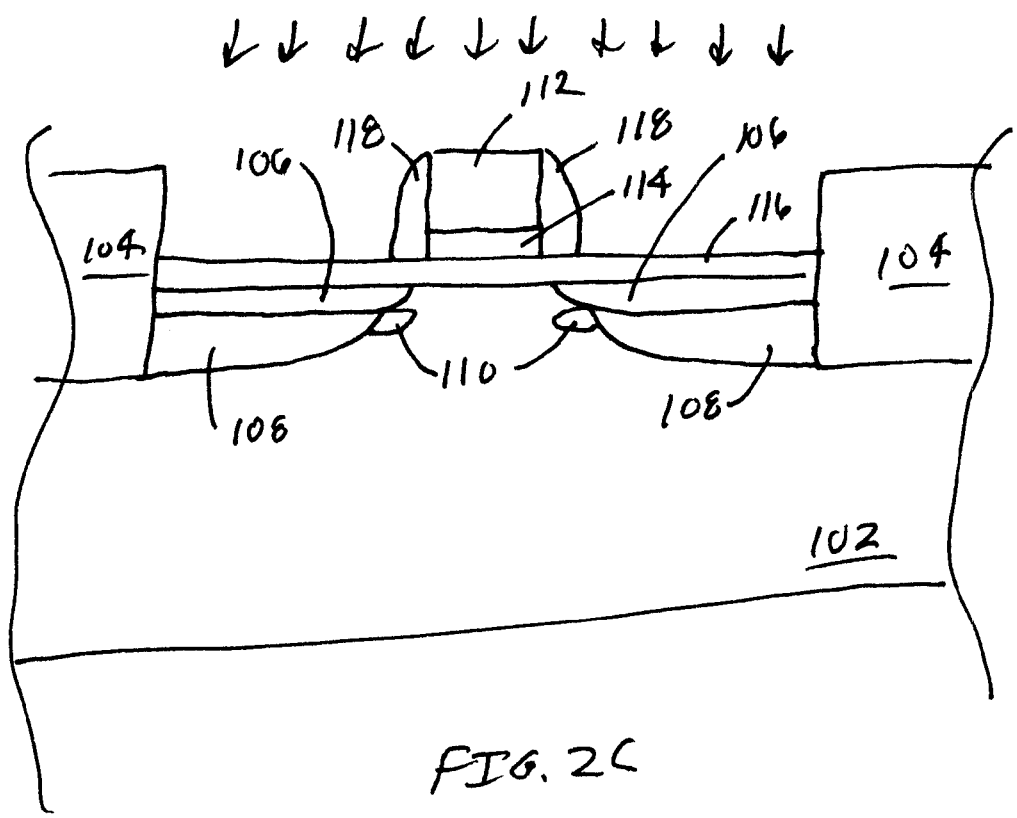

Now referring to FIGS. 2A–2C, cross-sectional diagrams of the transistor of FIG. 1 at various stages of fabrication are shown. The substrate 102 is processed through the formation of isolation regions 104 and any well implants and threshold adjust implants 116 as is well known in the art. A gate structure 120 is formed on the threshold adjust implant 116 above the substrate 102. Gate structure 120 may comprise a gate electrode and gate dielectric or a disposable gate structure as is known in the art. If the gate electrode and dielectric are formed at this point (as opposed to a disposable gate), the gate dielectric may be a remote-plasma nitrided oxide for smaller (about 0.1 micron) transistors. Other gate dielectric materials suitable include oxide or nitrided oxide by means other than remote-plasma nitridation. The gate pattern/etch may be accomplished with a deep UV surface-imaging lithography with linewidth reduction etch to achieve a short gate length.

Thin sidewall spacers 118 are then formed on the sidewalls of gate structure 120. Prior to formation of sidewall spacers 120, a thin thermal oxide of thickness 3–6 nanometers may be formed during a gate sidewall-reoxidation process to in part repair any gate etch damage to the underlying gate oxide. This thin thermal oxide from the sidewall re-oxidation process is not shown in FIG. 2A. Similarly, after formation of sidewall spacers 118, a thin thermal oxide of thickness about 2–3 nm may be formed if desired as a screen oxide before a subsequent implantation processes. Spacers 118 are formed prior to the highly doped drain (HDD) extension implant 116. This is done to reduce the gate to drain capacitance and thus the minimum gate length that the transistor can operate without excessive leakage between source and drain regions. Spacers 118 comprise a blocking material, preferably silicon nitride or silicon carbide. However, they may comprise any material having a smaller implant range than the substrate. The material is chosen to reduce the implant range of dopants thus preventing dopants from reaching the surface of substrate 102 under the spacer 118 during a subsequent implantations. The material may also reduce the lateral extension of dopants from the drain extension edge inwards to the channel at the surface of substrate 102 during subsequent implantation. Another advantage of using silicon nitride or silicon carbide for spacers 118, is that the thickness of spacer 118 will not substantially decrease during subsequent clean-up or resist stripping processes. In contrast, the thickness of currently used oxide spacers is affected by these subsequent processes. As transistors continue to scale to smaller dimensions, slight variations or uncontrolled reductions in spacer thicknesses have greater impact on transistor characteristics.

Now referring to FIG. 2B, the nMOS and pMOS HDD implants are performed (The PMOS HDD region is not shown.) A reduced energy implant of arsenic (n-type) or BF2 (p-type) at 10 keV–20 keV may be used. A pre-amorphization implant (such as a low energy Sb, non-counterdoping implant for low diode leakage current) may be utilized prior to the pMOS HDD implant for shallower junctions. The HDD implant is shown as non-angled. However, angled HDD implants may be used if desired. For HDD implant at sufficiently reduced energies (such as less than 10 keV), it may be that the HDD implants can be performed prior to spacers 118 if the gate-source and gate-drain capacitance is acceptable. A typical HDD implant dose for arsenic of BF2 is in the range of 2E14–1.2E15/cm.sup.2.

Referring now to FIG. 2C, angled or non-angled halo implants 110 (of opposite conductivity to the HDD implant) are performed and the structure may then be subjected to a rapid thermal anneal (RTA). Spacers 118 reduce the implant range of dopants thus preventing dopants from reaching the surface of substrate 102 and/or reduce the lateral extension of halo dopants from the drain extension edge inwards to the channel at the surface of substrate 102 during an angled halo implant. Dopant is placed below spacers 118 due to the angling of the implant. It is noted that the order of the HDD implant and the halo implant 110 can be reversed if desired. The fluorine implantation (not shown) can be performed before or after the halo implantation 100 to tailor one or more of the transistor characteristics. The one or more characteristics of the transistor may include halo segregation, halo diffusion, the sharpness of the halo profile, dopant activation, dopant profile sharpness, drive current, bottom wall capacitance or near edge capacitance. As will be described below, the dose and energy of the fluorine implant will vary depending on the desired transistor characteristics. Thereafter, the dopant materials are activated using a thermal process and any residual fluorine is removed during annealing.

Figure 3:
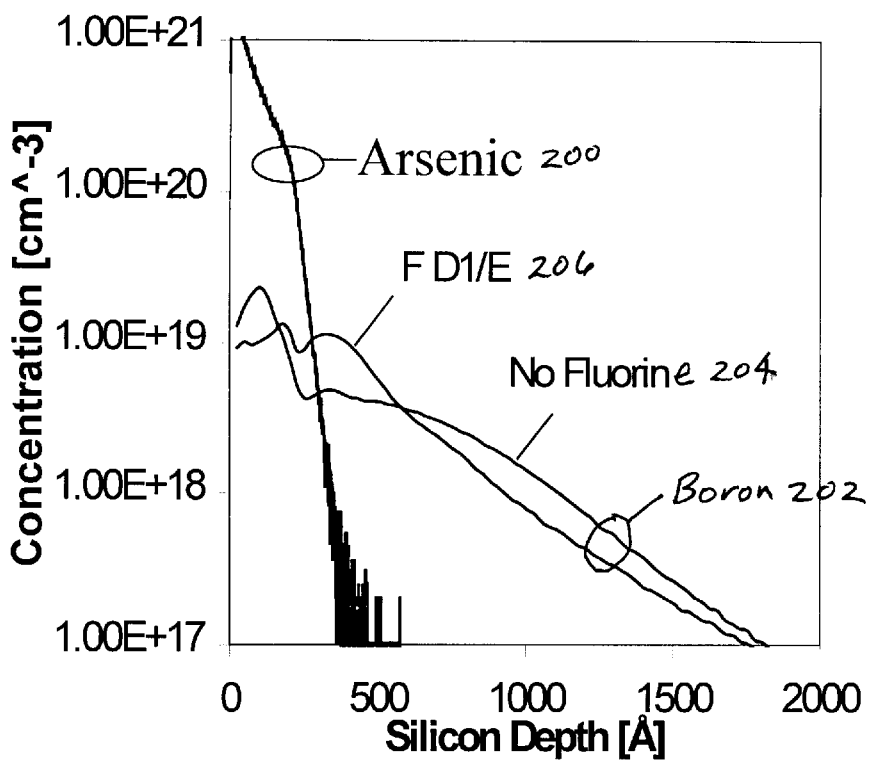
FIG. 3 are SIMS profiles illustrating that the fluorine halo process of the present invention reduces halo dose segregation and channeling/diffusion profile width in a nMOS transistor.
Figure 4:
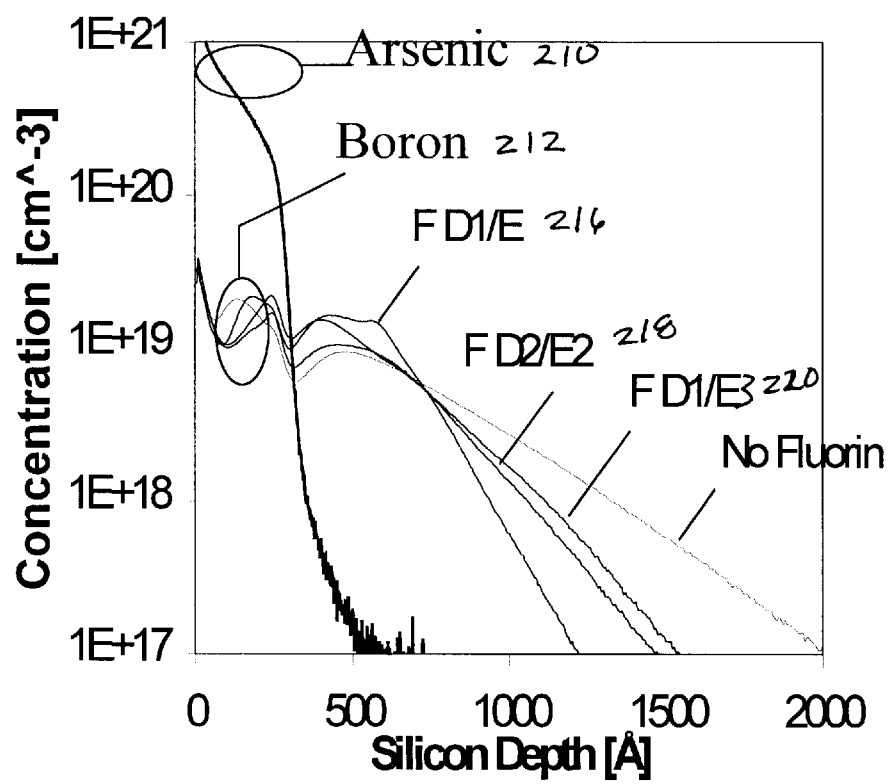
FIG. 4 are SIMS profiles illustrating that the fluorine halo process of the present invention produces varying degrees of halo dose segregation and profile sharpness in a nMOS transistor.
Figure 5:
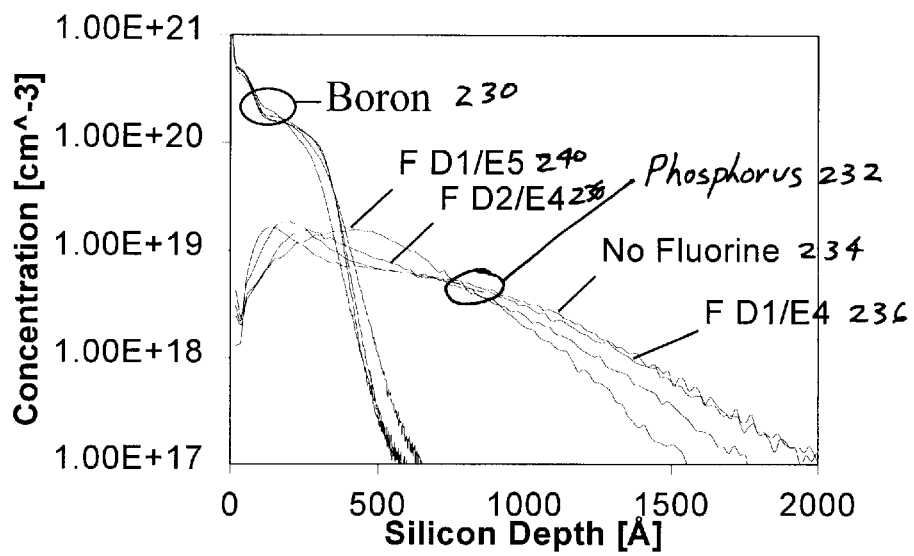
FIG. 5 are SIMS profiles illustrating that the fluorine halo process of the present invention produces varying degrees of halo dose segregation and profile sharpness, HDD dopant activation and HDD profile sharpness in a pMOS transistor.

The fluorine-assisted super-halo process described above was tested and analyzed for sub-50 nm transistors. The present invention's ability to produce super-sharp halo using fluorine is demonstrated by the 1-D SIMS profiles shown in FIGS. 3–5. The impact of the resulting fluorine-assisted halo dopant profile on the transistor characteristics was evaluated using TCAD simulations and is shown in FIGS. 6–11. This experimental data showed that the fluorine-assisted halo process of the present invention significantly enhances device resulting in lowered junction capacitance (Cj) and improved Ion-Ioff characteristic for both nMOS and pMOS More specifically, a set of SIMS wafers with HDD implants, pre-halo fluorine implants at different energies (E1, E2<E3, E4<E5) and doses (D1>D2), and halo implants were generated and are shown in FIGS. 3–5. The dopant profiles are measured using CAMECA IMS-4f/6f Secondary Mass Spectrometers ("SIMS") with $O_2^+$ primary beam. The TCAD simulations, using a TSUPREM4 process simulator tuned to the SIMS profile, were performed to predict expected transistor electrical characteristics and are shown in FIGS. 6–11. Bulk CMOS transistors with gate lengths down to 40 nm were fabricated using a standard CMOS process. After the poly-silicon gate etch, some wafers received the fluorine halo process. Fluorine implants at different energies and doses are used, with high angle boron or phosphorus halo implant. The fluorine can be implanted at no tilt angle or at a tilt angle. If no tilt angle is used, fluorine implantation in the gate oxide will be prevented. But, a tilt angle can be used to create a lateral amorphous region that will reduce lateral diffusion more than if no tilt angle is used. Accordingly, the angle of fluorine implantation will depend on the transistor, sensitivity and performance requirements. Cross-sectional transmission electron microscope (XTEM) images were obtained to measure the defect distribution in the silicon at the end of the process as shown in FIG. 12.

Referring now to FIG. 3, SIMS profiles illustrating that the fluorine halo process of the present invention reduces halo dose segregation and channeling/diffusion profile width in a nMOS transistor are shown. The profile shows concentration in cubic centimeters versus silicon depth in angstroms. Arsenic 200 is the dopant material and boron 202 is the halo material. Plot 204 shows the boron halo without fluorine implantation. Plot 206 shows the boron halo with fluorine implantation of dose D1 and energy E. As shown, the fluorine implant can be used to tailor the halo profile.

Now referring to FIG. 4, SIMS profiles illustrating that the fluorine halo process of the present invention produces varying degrees of halo dose segregation and profile sharpness in a nMOS transistor are shown. The profile shows concentration in cubic centimeters versus silicon depth in angstroms. Arsenic 210 is the dopant material and boron 212 is the halo material. Plot 214 shows the boron halo without fluorine implantation. Plots 216, 218 and 220 show how the fluorine implant can be used to tailor the halo profile. Plot 216 shows the boron halo with fluorine implantation of dose D1 and energy E. Plot 218 shows the boron halo with fluorine implantation of dose D2 and energy E2. Plot 220 shows the boron halo with fluorine implantation of dose D1 and energy E3. Moreover, the halo profile sharpness and the amount of dopant segregated into HDD can be independently affected by using different fluorine implant conditions.

Referring now to FIG. 5, SIMS profiles illustrating that the fluorine halo process of the present invention produces varying degrees of halo dose segregation and profile sharpness, HDD dopant activation and HDD profile sharpness in a pMOS transistor are shown. The profile shows concentration in cubic centimeters versus silicon depth in angstroms. Boron 230 is the dopant material and phosphorus 232 is the halo material. Plot 234 shows the phosphorus halo without fluorine implantation. Plots 236, 238 and 240 show how the fluorine implant can be used to tailor the halo profile. Plot 236 shows the phosphorus halo with fluorine implantation of dose D1 and energy E4. Plot 238 shows the phosphorus halo with fluorine implantation of dose D2 and energy E4. Plot 240 shows the phosphorus halo with fluorine implantation of dose D1 and energy E5. Moreover, the halo profile sharpness and the amount of dopant segregated into HDD can be independently affected by using different fluorine implant conditions.

Figure 6:
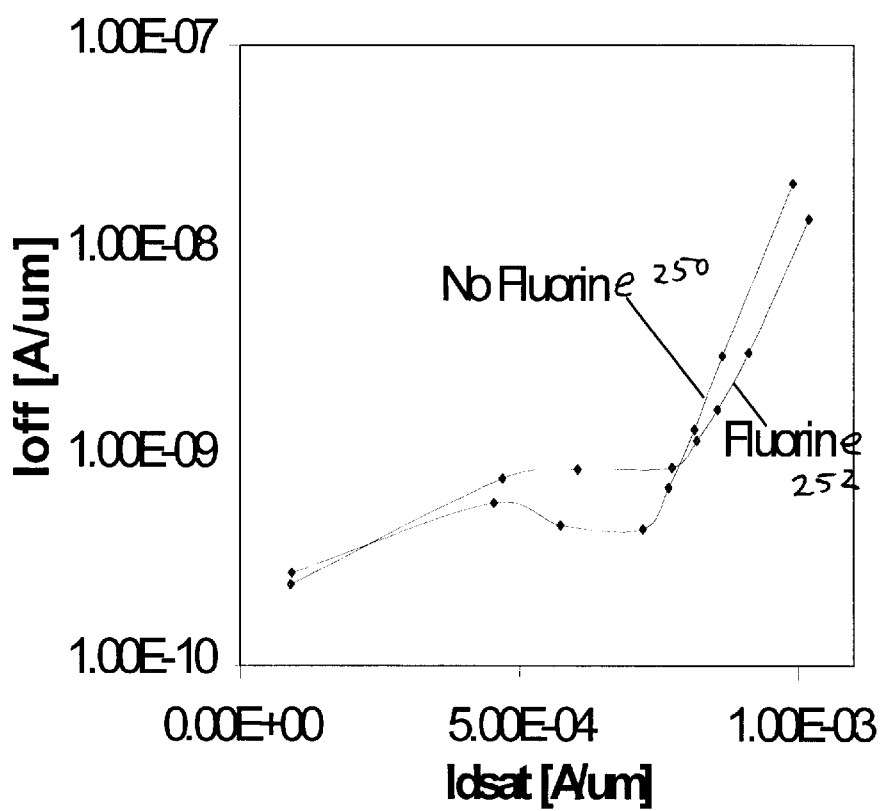
FIG. 6 is a graph of Idsat versus Ioff comparing the fluorine halo process of the present invention with a non-fluorine halo process in a nMOS transistor.

Now referring to FIG. 6, a graph of Idsat versus Ioff comparing the fluorine halo process 252 of the present invention with a non-fluorine halo process 250 in a nMOS transistor is shown. The increase in drive current is attributed to higher channel mobility, which is the result of reduced dopant diffusion and pileup at the gate oxide-silicon interface. Although the experimental lot had a lower than normal Ids due to higher series resistance, the relative comparison between the fluorine and non-fluorine processes is still valid. As shown, the fluorine halo process can be used to tailor the transistor DC electrical characteristics.

Figure 7:
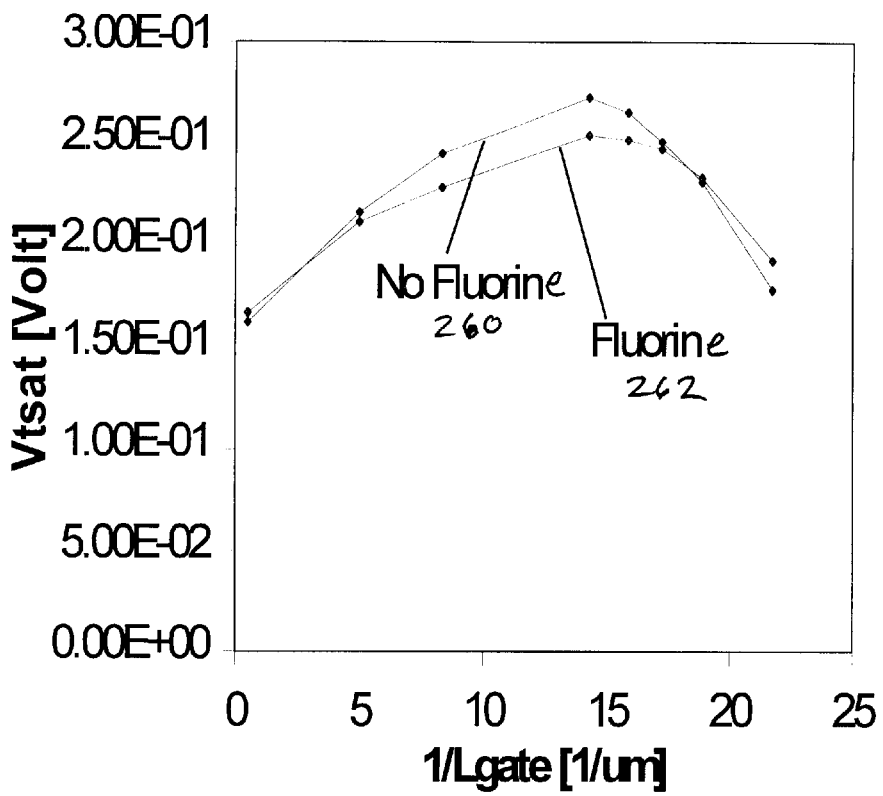
FIG. 7 is a graph of Vt roll off results between the fluorine halo process of the present invention and a non-fluorine halo process in a nMOS transistor.

Referring now to FIG. 7, a graph of Vt roll off results between the fluorine halo process 262 of the present invention and a non-fluorine halo process 260 in a nMOS transistor is shown. The improvement in Vt roll-off is credited to having a sharper halo profile into the channel and a smaller depletion width due to reduced halo dopant segregation into HDD region. As shown, the fluorine halo process can be used to tailor the transistor DC electrical characteristics.

Figure 8:
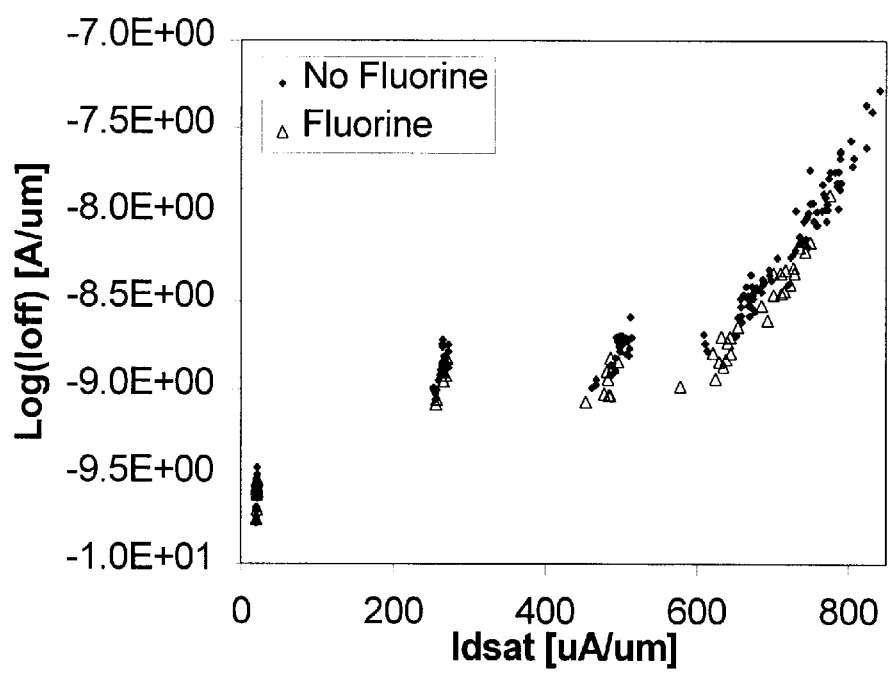
FIG. 8 is a graph of Ion versus Ioff comparing the fluorine halo process of the present invention with a non-fluorine halo process in a nMOS transistor.

Now referring to FIG. 8, a graph of Ion versus Ioff comparing the fluorine halo process of the present invention with a non-fluorine halo process in a nMOS transistor is shown. Under the same Cgd, Tox_inv, and halo implant conditions, the Ids shows an improvement of 3.9% at Ioff=3 nA for nMOS transistors using the present invention. Although the nMOS drive current did not improve at Ioff=10 nA, the fluorine halo process transistor has a smaller Lgmin and 17% smaller capacitance between the doped extension and the near gate edge ("Cjswg") than the non-fluorine process, even with the same halo implant energy and dose. As shown, the fluorine halo process can be used to tailor the transistor DC electrical characteristics.

Figure 9:
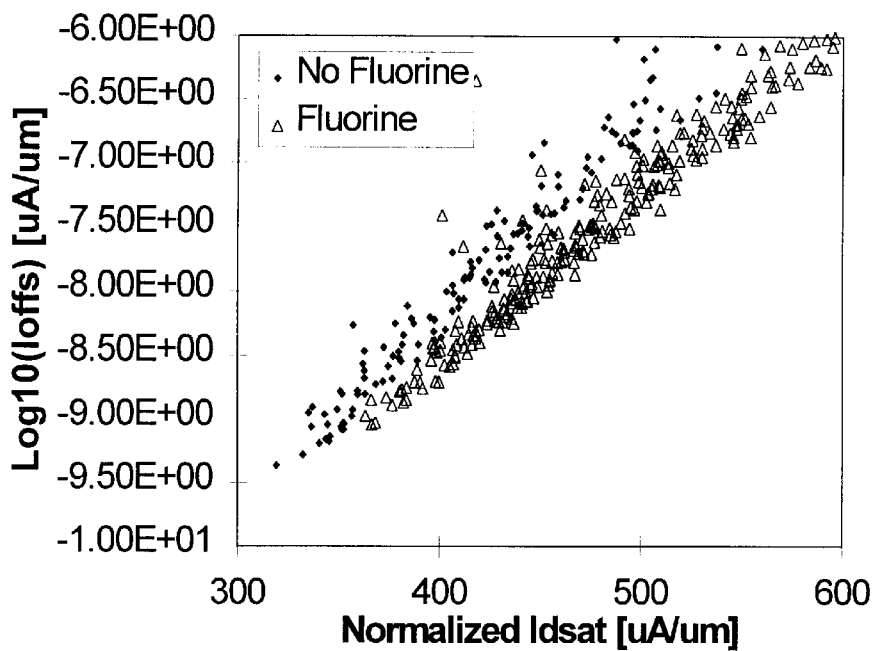
FIG. 9 is a graph of Ion versus Ioff comparing the fluorine halo process of the present invention with a non-fluorine halo process in a pMOS transistor.

Referring now to FIG. 9, a graph of Ion versus Ioff comparing the fluorine halo process of the present invention with a non-fluorine halo process in a pMOS transistor is shown. Under the same Cgd, Tox_inv, and halo implant conditions, the Ids shows an improvement of 6% at Ioff=10 nA for pMOS transistors using the present invention. Part of the drive current improvement observed for pMOS is due to boron drain extension having ~35% higher activation level at the knee of the profile and 27% sharper gradient as shown in FIG. 5. As shown, the fluorine halo process can be used to tailor the transistor DC electrical characteristics.

Figure 10:
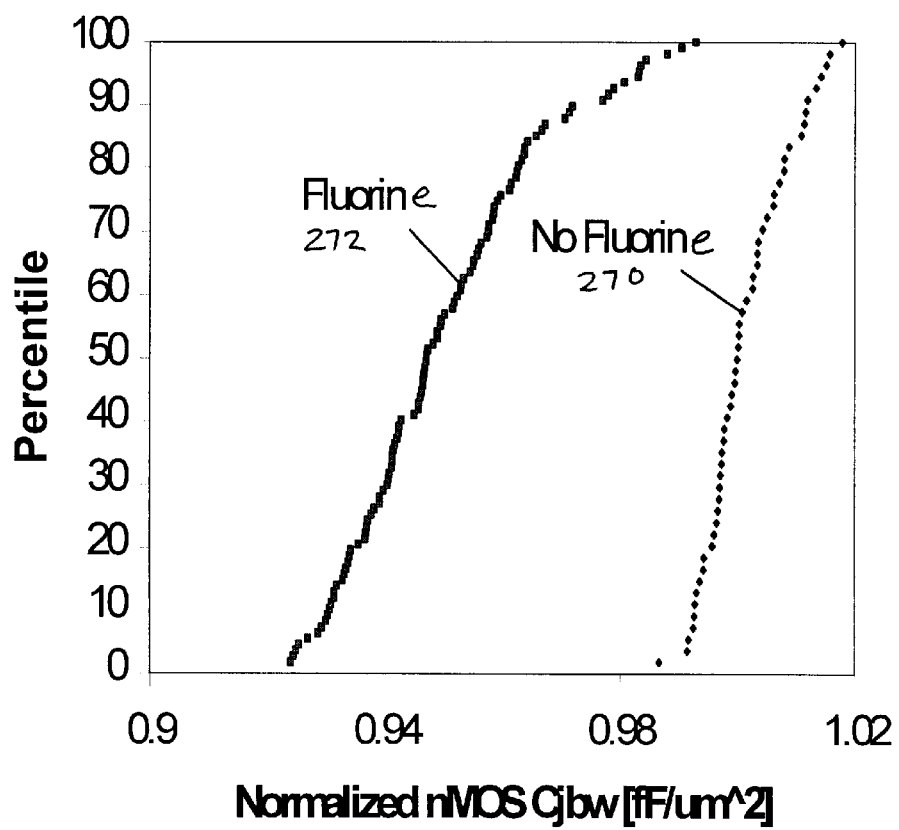
FIG. 10 is a graph of Cjbw results between the fluorine halo process of the present invention and a non-fluorine halo process in a nMOS transistor.

Now referring to FIG. 10, a graph of bottom wall capacitance ("Cjbw") results between the fluorine halo process 272 of the present invention and a non-fluorine halo process 270 in a nMOS transistor is shown. The pMOS Cjbw is reduced by 11% using the present invention. As shown, the fluorine halo process can be used to tailor the transistor DC electrical characteristics.

Figure 11:
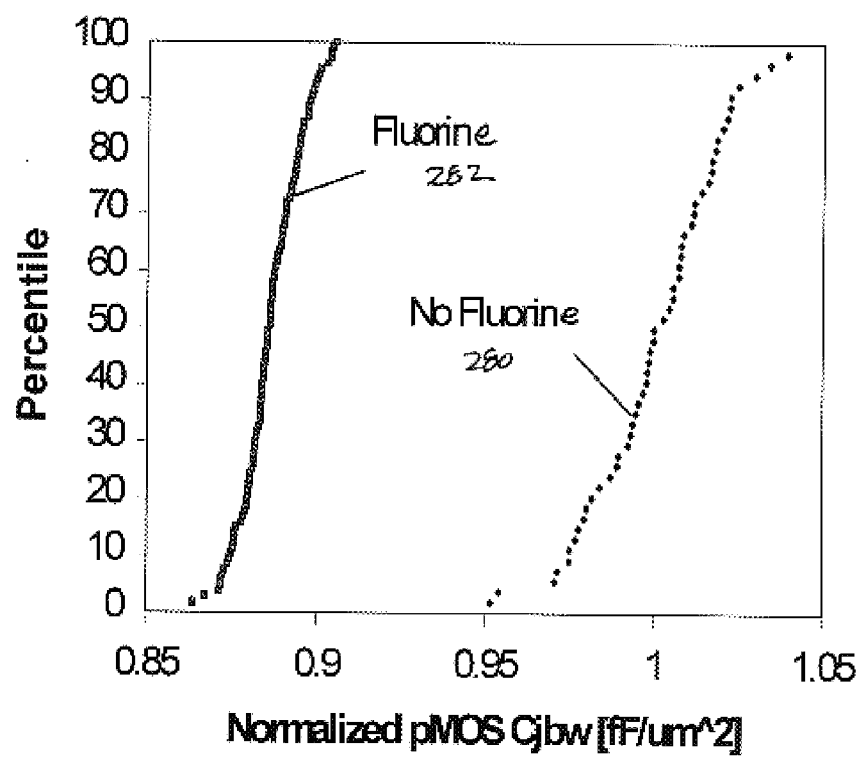
FIG. 11 is a graph of Cjbw results between the fluorine halo process of the present invention and a non-fluorine halo process in a pMOS transistor.
Figure 12:
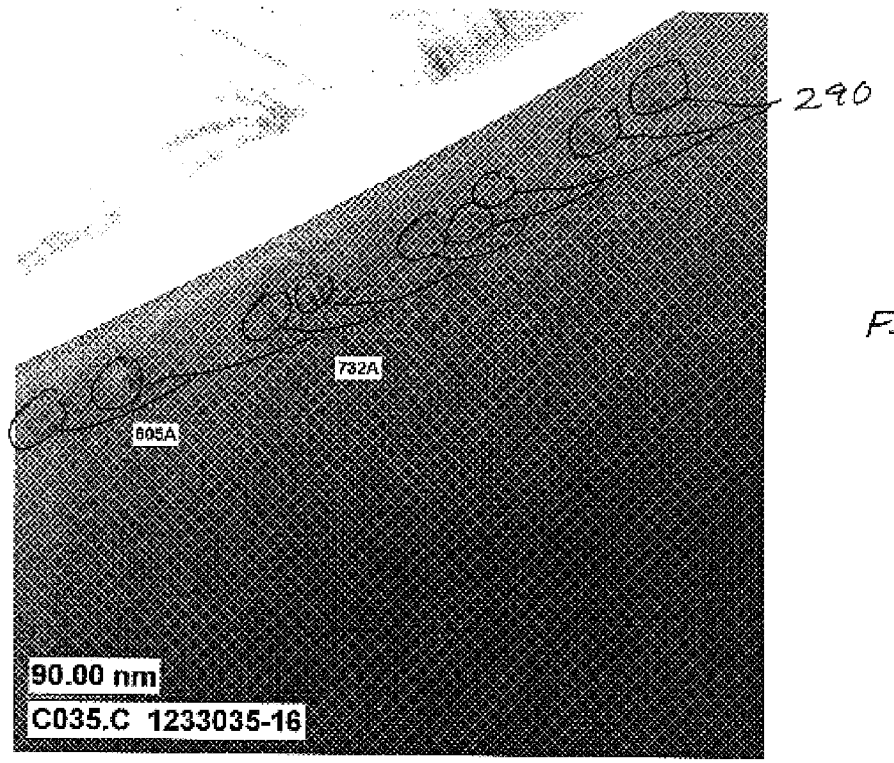
FIG. 12 is a XTEM image showing the existence of silicon defects in a non-optimized fluorine halo.

Referring now to FIG. 11, a graph of Cjbw results between the fluorine halo process 282 of the present invention and a non-fluorine halo process 280 in a pMOS transistor is shown. The nMOS Cjbw can be reduced by as much as 5.8% using the present invention if fluorine implant conditions are optimized. As shown, the fluorine halo process can be used to tailor the transistor DC electrical characteristics.

Now referring to FIG. 12, a XTEM image showing the existence of silicon defects 290 in a non-optimized fluorine halo is shown. These silicon defects 290 cause higher leakage current or higher intrinsic carrier concentration that most likely explain the smaller improvement observed in experimental results, especially for the nMOS transistor, compared to simulation data.

As a result of the foregoing discussion, fluorine can be used as an effective means to produce super-halo for sub-50 nm transistors. SIMS profiles show that fluorine is capable of tailoring halo profiles for different transistor requirements. Based on TCAD simulations, a 5.5% drive current improvement is possible.

The embodiments and examples set forth herein are presented to best explain the present invention and its practical application and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. Many modifications and variations are possible in light of the above teaching without departing from the spirit and scope of the following claims.

What is claimed is:

1. A method for forming a transistor junction in a semiconductor wafer, comprising the steps of:

implanting a dopant material into the semiconductor wafer;

implanting a halo material into the semiconductor wafer;

selecting a fluorine dose and energy to tailor one or more characteristics of the transistor wherein the one or more characteristics of the transistor includes bottom wall and near edge capacitance;

implanting fluorine into the semiconductor wafer at the selected dose and energy;

activating the dopant material using a thermal process; and annealing the semiconductor wafer to remove residual fluorine.

2. A method of fabricating a transistor, comprising the steps of:

forming a gate dielectric over a semiconductor body;

forming a gate electrode over the gate dielectric;

forming an implant blocking spacer adjacent sidewalls of the gate electrode;

forming a first doped region of a first conductivity type in the semiconductor body adjacent the implant blocking spacer;

forming a halo region of a second conductivity type in the semiconductor body at least partially under the implant blocking spacer to form a halo in the semiconductor body;

selecting a fluorine dose and energy to tailor one or more characteristics of the transistor wherein the one or more characteristics of the transistor includes bottom wall and near edge capacitance;

implanting fluorine into the halo region at the selected dose and energy;

forming a sidewall spacer adjacent to the implant blocking spacer; and forming deep source/drain region in the semiconductor body aligned to the sidewall spacer.

\* \* \* \* \*